US008101851B2

(12) United States Patent
Dubbeldam

(10) Patent No.: US 8,101,851 B2
(45) Date of Patent: Jan. 24, 2012

(54) PROCESS FOR MANUFACTURING A SOLAR CELL FOIL USING A TEMPORARY SUBSTRATE

(75) Inventor: Gerrit Cornelis Dubbeldam, Zevenaar (NL)

(73) Assignee: Akzo Nobel N.V., Arnhem (NL)

( * ) Notice: Subject to any disclaimer, the term of this patent is extended or adjusted under 35 U.S.C. 154(b) by 1290 days.

(21) Appl. No.: 10/563,761

(22) PCT Filed: Jul. 16, 2004

(86) PCT No.: PCT/EP2004/008007
§ 371 (c)(1),
(2), (4) Date: Mar. 8, 2006

(87) PCT Pub. No.: WO2005/015638
PCT Pub. Date: Feb. 17, 2005

(65) Prior Publication Data
US 2006/0151023 A1    Jul. 13, 2006

(30) Foreign Application Priority Data
Jul. 22, 2003    (EP) .................................... 03077278

(51) Int. Cl.
H01L 31/0392    (2006.01)
H01L 31/0236    (2006.01)
(52) U.S. Cl. ........ 136/256; 136/244; 136/258; 136/261; 136/251; 257/433; 257/459; 257/443; 438/61; 438/62; 438/80; 438/89; 438/96; 438/98
(58) Field of Classification Search .................. 136/256, 136/244, 258, 261, 251; 257/433, 459, 443; 438/61, 62, 80, 89, 96, 98
See application file for complete search history.

(56) References Cited

U.S. PATENT DOCUMENTS
4,243,432 A * 1/1981 Jordan et al. .................. 136/244
(Continued)

FOREIGN PATENT DOCUMENTS
DE    39 35 826 A1    6/1990
(Continued)

OTHER PUBLICATIONS
R.E.I. Schropp et al., "Novel Amorphous Silicon Solar Cell Using a Manufacturing Procedure with a Temporary Superstrate." Amorphous and Heterogeneous Silicon Thin Films: Fundamentals to Devices—1999. Materials Research Society Symposium Proceedings, vol. 557, pp. 713-718.

*Primary Examiner* — Alexa Neckel
*Assistant Examiner* — Golam Mowla
(74) *Attorney, Agent, or Firm* — Oliff & Berridge, PLC

(57) ABSTRACT

The invention pertains to a process for manufacturing a solar cell foil comprising the steps of:
  providing an etchable temporary substrate
  applying a front electrode of a transparent conductive oxide (TCO) onto the temporary substrate
  applying a photovoltaic layer onto the TCO layer
  applying a back electrode layer
  applying a permanent carrier
  ensuring that the front electrode and the back electrode are electrically connected in an interconnect to establish a series connection, the front and the back electrode each being interrupted by front and back groove, respectively, at different sides of the interconnect
  in any one of the preceding steps providing an etch resist on the non-TCO side of the temporary substrate at least at the location of the interconnect, and at least not at the entire location of the front groove
  selectively removing the temporary substrate where it is not covered with etch resist.
The process of the invention provides a cap of a protective material on the interconnect, leading to a solar cell foil with improved properties.

13 Claims, 6 Drawing Sheets

U.S. PATENT DOCUMENTS

| | | | |
|---|---|---|---|
| 4,697,042 A | 9/1987 | Schilling | |
| 4,749,454 A * | 6/1988 | Arya et al. | 205/656 |
| 5,328,519 A * | 7/1994 | Kawakami | 136/244 |
| 5,453,134 A * | 9/1995 | Arai et al. | 136/244 |
| 5,637,510 A | 6/1997 | Morikawa et al. | |
| 6,184,057 B1 | 2/2001 | Van Andel et al. | |
| 6,472,593 B1 * | 10/2002 | Middelman et al. | 136/248 |
| 6,613,598 B1 | 9/2003 | Middelman et al. | |
| 6,951,770 B2 * | 10/2005 | Middelman et al. | 438/57 |
| 2001/0037823 A1 | 11/2001 | Middelman et al. | |
| 2010/0087026 A1 * | 4/2010 | Winkeler et al. | 438/61 |

FOREIGN PATENT DOCUMENTS

| | | |
|---|---|---|
| EP | 0 210 451 A2 | 2/1987 |
| EP | 0 098 004 A1 | 10/1999 |
| JP | A 10-093125 | 4/1998 |
| WO | WO 98/13882 | 4/1998 |
| WO | WO 99/49483 | 9/1999 |
| WO | WO 01/47020 A1 | 6/2001 |
| WO | WO 01/78156 A1 | 10/2001 |
| WO | WO 03/001602 A2 | 1/2003 |

* cited by examiner

PROCESS FOR MANUFACTURING A SOLAR CELL FOIL USING A TEMPORARY SUBSTRATE

The invention pertains to a process for manufacturing a solar cell unit using a temporary substrate. The invention also pertains to the solar cell foils thus obtained.

Solar cell foils, also known as photovoltaic foils, generally comprise a carrier and a photovoltaic (PV) layer composed of a semiconductor material provided between a front electrode comprising a transparent conductive oxide (TCO) (at the front of the foil) and a back electrode (at the back of the foil). The front electrode is transparent, enabling incident light to reach the semiconductor material, where the incident radiation is converted into electric energy. In this way light can be used to generate electric current, which offers an interesting alternative to, say, fossil fuels or nuclear power.

WO 98/13882 and WO99/49483 describe a method for manufacturing a photovoltaic foil comprising the steps of providing a temporary substrate, applying the transparent conductive oxide, applying a photovoltaic layer, applying the back electrode layer, applying the carrier, removing the temporary substrate, and, preferably, applying a transparent protective top coat on the transparent conductor layer. This method enables the roll-to-roll manufacture of a photovoltaic foil or device, while at the same time making it possible to use any desired transparent conductor material and deposition process without jeopardizing the current-generating action of the PV layer. In WO 98/13882 an etch resistant may be used to cover the non-adjacent most left and most right transparent conductor tracks to provide electric contact between these side-tracks and the side electrodes, By allowing in such manner part of the temporary substrate to remain in place these contacts do not need to be applied separately. WO 01/78156 and WO 01/47020 describe variations on this process.

The maximum voltage of a solar cell is determined by the intensity of the incident light and by the composition of the cell, more particularly, by the nature of the semiconductor material. When the surface area of the solar cell is increased, more power is generated, but the voltage remains the same. In order to increase the voltage, a solar cell foil is often divided into different cells, which are connected in series. This is done by providing grooves in the solar cell electrode layers, e.g., by using a laser or by means of etching or any other patterning method, and establishing a conductive contact between the front electrode of one cell and the back electrode of another, while interrupting the front electrode and the back electrode each at a different side of the interconnect so as to prevent short-circuiting. When a solar cell foil is employed, the individual cells are held together by the carrier. The above-mentioned patent applications describe various ways of effecting the series connection.

It has appeared, however, that the photovoltaic foils prepared by the processes described in the above references may suffer from loss of quality when they are provided with a series connection. It was found to be difficult to provide photovoltaic foil with a homogeneous and high product quality. More in particular, it was found that during the removal of the temporary substrate by etching, the TCO layer may be damaged at the location of the interconnect. During the etching step, the etchant may permeate the damaged TCO layer and enter into the interconnect, therewith disrupting it. One of the problems is the possibility of occurrence of short-circuit between two separated parts of TCO layer by remaining temporary substrate. There is therefore a need for a more robust process for preparing a solar cell foil provided with a series connection via a temporary substrate, one which results in a more homogeneous product of higher quality and minimal short-circuit problems. The present invention provides such a process.

The present invention thus pertains to a process for manufacturing a solar cell foil comprising the steps of:
  providing an etchable temporary substrate
  applying a front electrode of a transparent conductive oxide (TCO) onto the temporary substrate
  applying a photovoltaic layer onto the TCO layer
  applying a back electrode layer
  applying a permanent carrier
  ensuring that the front electrode and the back electrode are electrically connected in an interconnect to establish a series connection, the front and the back electrode each being interrupted by front and back groove, respectively, at different sides of the interconnect
  in any one of the preceding steps providing an etch resist on the non-TCO side of the temporary substrate at least at the location of the interconnect, and at least not at the entire location of the front groove
  selectively removing the temporary substrate where it is not covered with etch resist.

The result of the process according to the invention is that at the location of the interconnect parts of the temporary substrate remain on the TCO layer. The presence of the resulting protective caps of temporary substrate material has been found to improve the properties of the solar cell foil as regards homogeneity and quality. More in particular, solar cell foils prepared by the process according to the invention show fewer non-functioning cells than comparable solar cell foils where the temporary substrate is removed in its entirety.

The present invention also pertains to a solar cell unit comprising a front electrode, a PV layer, and a back electrode layer, wherein the solar cell unit is divided into at least two individual cells connected in series, the series connection comprising an interconnect which electrically connects the front electrode of one cell with the back electrode of an adjacent cell, while the front and the back electrode are each interrupted at different sides of the interconnect, in which solar cell unit a protective cap is present on the front electrode at the location of the interconnect, with the protective cap being of a different material than the interconnect. This solar cell unit can be obtained through the process of the present idea, but also through different processes. Preferably, the solar cell unit is a flexible solar cell foil suitable for handling in a roll-to roll process.

The process and the solar cell unit of the present invention have several additional advantages.

In the first place, if the protective cap is made up of a conductive material, e.g., when it originates from a temporary substrate made of a conductive material, the protective cap can function as part of the interconnect, thus improving the conductive properties of the interconnect. This also allows for less stringent control of the conditions applied in manufacturing the interconnect as regards the properties of the TCO, because even if the TCO is damaged during the manufacture of the interconnect, the presence of the protective cap of conductive temporary substrate material ensures that the interconnect will function properly.

Further, by appropriate connection, the strip of temporary substrate remaining on the TCO layer can be made to function as part of a current collection grid, that is, a pattern of lines of a conductive material which is applied in such a way as to enable easy collection of the current carriers (electrons) generated in the photovoltaic layer and flowing through the electrode. As the solar cell does not generate energy at the location of the interconnect, the interconnect is an ideal location for the grid, since its presence at that location does not detrimentally affect the current-generating properties of the solar cell foil.

Further, the presence of conductive strips on the interconnect makes it easier to divide the solar cell foil into individual units, since the conductive strips can be formatted in such a manner that they can be used for attaching electrodes to connect the solar cell foil to the "outside world".

In the context of the present specification, the term etching is intended to mean removing by chemical means, e.g., dissolution. An etchable substrate is a substrate which can be removed by chemical means; an etch resist is a material which can resist at least temporarily the conditions applied during the removal of the temporary substrate. The etch resist can be any material which can be applied to the temporary substrate at the location of the interconnect and which will protect the temporary substrate at least temporarily from the action of the etchant. Various types of etch resist may be envisaged. In the first place, there is the etch resist which is resistant to the actions of the etchant and which will not be removed from the temporary substrate at some stage of the process. This type of etch resist is indicated as a permanent etch resist. In contrast, one may also envisage a temporary etch resist, viz. an etch resist that will be removed at some further stage of the process.

The formation of protective caps from the temporary substrate using the etch resist may be effected in various ways. For example, one may apply an etch resist, carry out the etching step, and optionally remove the etch resist in some further step. It may be that the temporary substrate is thicker than is desired for the protective cap. In that case, one can first etch part of the temporary substrate, then apply the etch resist, and subsequently remove the unprotected portion of the temporary substrate. In that case one may also first apply a temporary etch resist, followed by partial removal of the temporary substrate where it is not protected by an etch resist. Then, the temporary etch resist is removed and a further etching step is performed to reduce the thickness of the protective cap. To effect the latter option it is also possible to use a material which is only temporarily resistant to the etchant. If this material, which is in effect an etch retardant, is used, the following will take place. At first, the etch retardant ensures that etching will take place only at the location where the temporary substrate is not protected by the etch retardant. Then, when the etch retardant has dissolved, the etchant ensures that the thickness of the protective cap is reduced.

A specific embodiment of the process of the invention is one in which the etch resist is a permanent etch resist the color of which has been selected such that the caps on the interconnect have a color which matches that of the energy-generating part of the solar cell unit or contrasts with it.

The color difference between the energy-generating part of the solar cell unit and a colored interconnect cap can be expressed by way of the dEab, which is defined as follows:

$$dEab = (dL^2 + da^2 + db^2)^{1/2}$$

wherein dL, da, and db are the differences in brightness, blueness, and redness, respectively, between the parts provided with coloring material and the energy-generating parts of the solar cell unit. The L, a, and b values can be determined in accordance with the CIELAB procedure using a D65 light source. If the color of the interconnect caps is to match that of the solar cell unit, the dEab generally is below about 5, preferably below about 2, more preferably, below about 0.3. In that case one can speak of the use of a camouflage color. If the color of the interconnect cap is selected to contrast with that of the energy-generating part of the solar cell unit, the dEab value generally is above about 10, preferably above about 12, more preferably between about 20 and 100. If more than one color is used, generally at least one of these colors will satisfy the above requirements for the dEab value.

The use of a combination of a distinguishing color and a matching color makes it possible to decorate the solar cell unit with colored designs on a homogeneous background. Examples of envisaged designs are patterns, letters, figures, stripes, rectangles, and squares. In this embodiment, generally 10-90% of the etch resist is provided with a distinguishing color, while 90-10% of the etch resist is provided with a camouflage color.

The application of the etch resist onto the temporary substrate can be carried out at any stage in the process according to the invention. It can, e.g., be applied before the beginning of the process, that is, before the application of the TCO onto the other side of the temporary substrate. It can be applied at any intermediate stage, and it can be applied at the end of the process, that is, after the application of the back electrode or, where applicable, the permanent carrier, and just before removal of the temporary substrate by etching. The latter option is preferred, because it prevents the etch resist pattern from being damaged during the preceding parts of the process. It also prevents the presence of the etch resist pattern on the "back" of the temporary substrate from interfering with the other processing steps. In the preferred roll-to-roll embodiment of the process according to the invention both may happen if the temporary substrate provided with a pattern in an etch resist on the back is led over one or more rolls. The application of the etch resist before the application of the transparent conductive oxide layer has the additional disadvantage that the etch resist should be able to withstand the high temperatures which are often applied in the deposition of the transparent conductive oxide layer.

In a preferred embodiment of the process according to the invention, the temporary substrate is flexible, a flexible permanent carrier is applied, and the process is carried out by way of a roll-to-roll process.

The Series Connection

The manner in which the series connection is carried out is not critical to the present invention. In general, the series connection is established by ensuring that the front electrode of one cell and the back electrode of an adjacent cell are electrically connected in an interconnect while the front and the back electrode are each interrupted at different sides of the interconnect.

As indicated above, in each solar cell unit, the back electrode and the front electrode (TCO layer) are interrupted, each at the other side of the interconnect. For both interruptions, the interrupting groove is present through the electrode layer itself and optionally also through the PV layer. For some of the embodiments to be discussed below, the presence of the groove through the PV layer will be described explicitly, but it may be applied in general. It should be noted, however, that if the interrupting grooves are present through the electrode layer and through the PV layer, care should be take to ensure that the electrode is not inadvertently short-circuited with the other electrode through the groove in the PV layer. Strips of an insulating material may be applied at the location where the above-mentioned interrupting grooves are to be applied, e.g., by laser-scribing. The insulating material will act as laser stop to prevent the formation of short-circuits by melting of the underlying material. For some of the embodiments to be discussed below, the provision of strips of an insulating material will be described explicitly, but they may be applied also in other embodiments. The insulating material may be applied on the TCO layer and/or on the PV layer, as applicable.

The interconnect can be established in various manners. It can be established by applying a groove through the PV layer and filling it with a conductive material. The groove may or may not extend through the TCO layer, through the back electrode layer, or through both the TCO layer and the back electrode layer. This will depend, int. al., on the process step in which the groove is applied. In one embodiment, the conductive material which is used to fill the groove in the PV layer is back electrode material. If the PV layer is an amorphous Si layer, the conductive connection can also be established by fusing the amorphous Si layer with the back electrode. If the PV layer is an amorphous Si layer, the interconnect can also be established by recrystallising the Si into a conductive material. This option is less preferred, however.

The sequence in which the interconnect and the interrupting grooves are applied is not critical and will depend on what is most suitable in the specific process applied.

The width of the interconnect and the grooves interrupting the TCO layer and the back electrode layer generally is determined by the following considerations. At the sites of the interconnect and the interrupting grooves, the solar cell is unable to convert light into electricity. In view of this, the interconnect and the grooves have to be as narrow as possible. On the other hand, they have to be wide enough to ensure that the desired effect, the interruption of the different layers and the connection of the front and the back electrode with sufficient conductivity, is attained. The grooves interrupting the TCO layer and the back electrode layer generally have a width of 2 to 200 µm, preferably of 5 to 75 µm. The interconnect generally has a width of 20 to 200 µm, preferably of 50 to 150 µm.

The strips of an insulating material that may be applied at the location where the above-mentioned interrupting grooves are to be applied should be wide enough to allow for easy provision of the interrupting grooves within the width of the strips. In general, the strips have a width between 25 and 1,000 µm, preferably between 50 and 400 µm, more preferably between 50 and 200 µm.

The protective cap should be broad enough to ensure that the interconnect is indeed protected. It generally extends at least 10 µm beyond the interconnect at both sides, preferably at least 50 µm. Generally, it will extend at most 200 µm beyond the interconnect at both sides, preferably at most 100 µm. Obviously, if the protective cap is conductive, it may not extend beyond the groove interrupting the TCO layer if that would mean that the two sides of the groove would become electrically connected.

The grooves interrupting the front and back electrodes generally are continuous grooves, since the objective is to achieve proper insulation of the various cell strips. The interconnect, on the other hand, does not need to be continuous. If so desired, it may have a discontinuous form, taking the form of holes, stripes, or pits. For reasons of operational efficiency a continuous embodiment may be preferred.

The invention is illustrated by the following figures.

Various embodiments of the process according to the invention can be envisaged.

Figure 1:
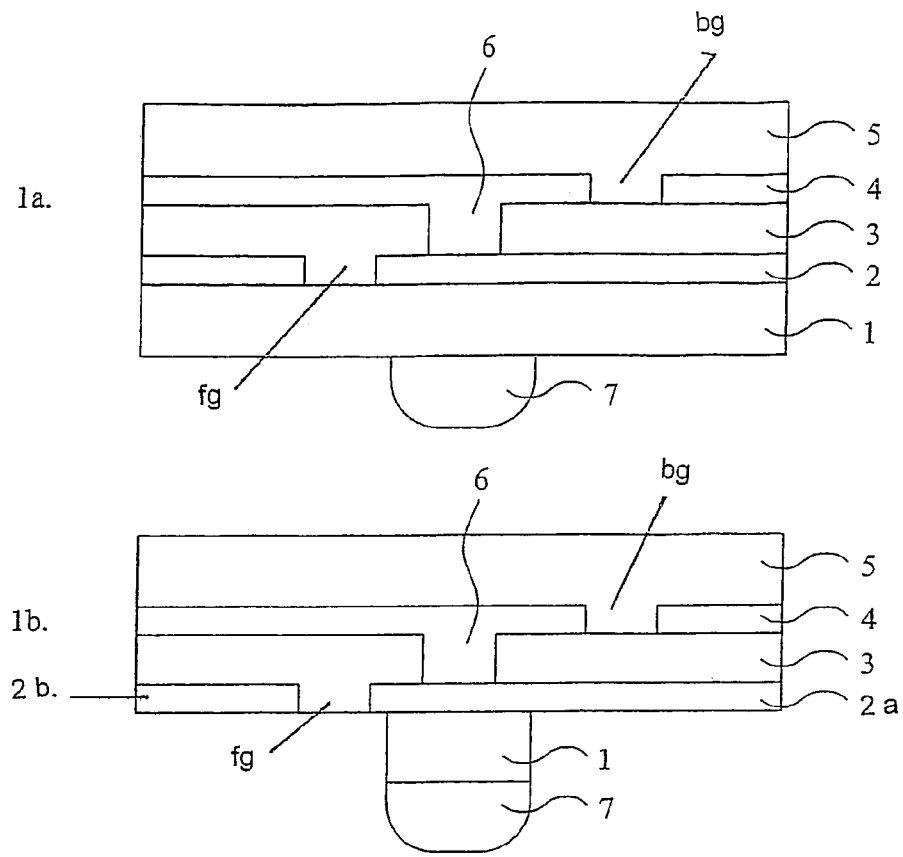
FIG. 1 shows process steps for making an interconnect between two adjacent cells of a solar module of the invention.

A first embodiment is a variation on the series connection process described in WO 98/13882. This process is illustrated in FIG. 1. It comprises the steps of:
  providing an etchable temporary substrate
  applying a front electrode of a transparent conductive oxide (TCO) onto the temporary substrate and providing grooves in the TCO layer down to the temporary substrate
  applying a photovoltaic layer (PV layer) onto the TCO layer and in the grooves present therein, and providing grooves in the PV layer down to the TCO layer
  applying a back electrode layer onto the PV layer and in the grooves present in the PV layer so as to form an interconnect which connects the back electrode layer to the TCO layer, and providing grooves in the back electrode layer down to the PV layer
  applying a permanent carrier on the back electrode
  in any one of the preceding steps applying an etch resist on the non-TCO side of the temporary substrate at the location of the interconnect
  selectively removing the temporary substrate where it is not covered with etch resist.

This process is illustrated in FIG. 1, wherein FIG. 1a shows a solar cell foil comprising a temporary substrate 1 with on top of it a TCO 2, a PV layer 3, a back electrode 4, and a permanent substrate 5. The interconnect 6 connects the TCO layer to the back electrode 4. An etch resist cap 7 is provided on the temporary substrate at the location of the interconnect. In FIG. 1b the same system is shown after removing the temporary substrate except where it is provided with the etch resist cap. No etch resistant is present at the location of the front groove fg, thus no remainder of the temporary substrate (usually a conductor such as aluminum) is present at the location of the front groove fg to cause short-circuit between separated TCO parts 2a and 2b.

Figure 2:
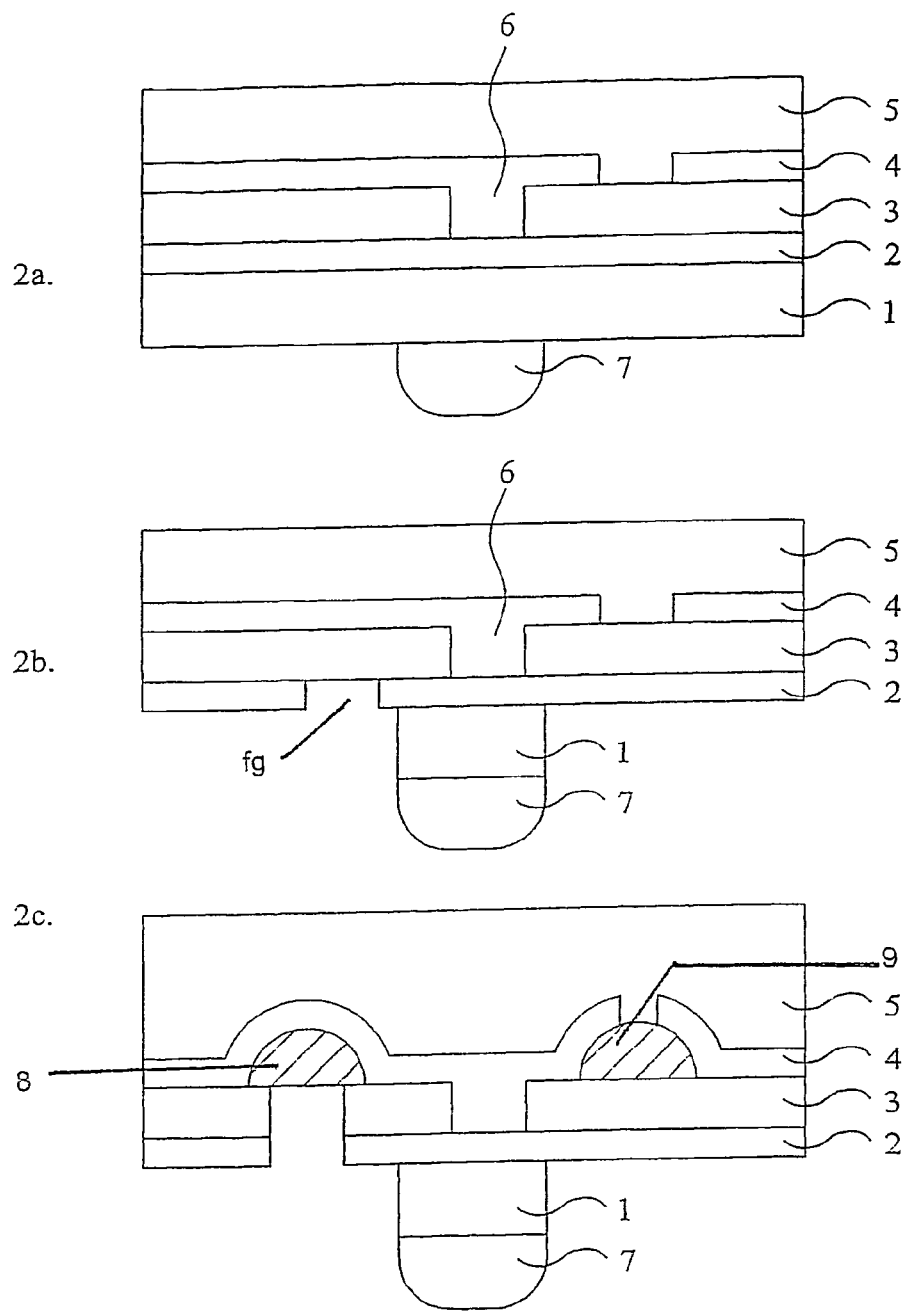
FIG. 2 shows another embodiment the solar module.

A second embodiment, some steps of which are illustrated in FIG. 2, is a process comprising the steps of:
  providing an etchable temporary substrate
  applying a front electrode of a transparent conductive oxide (TCO) onto the temporary substrate
  applying a photovoltaic layer (PV layer) onto the TCO layer and providing grooves in the PV layer down to the TCO layer
  applying a back electrode layer onto the PV layer and in the grooves present in the PV layer so as to form an interconnect which connects the back electrode layer to the TCO layer, and providing grooves in the back electrode layer down to the PV layer or through the PV layer down to the TCO layer
  applying a permanent carrier
  in any one of the preceding steps providing an etch resist on the non-TCO side of the temporary substrate at the location of the interconnect
  selectively removing the temporary substrate where it is not covered with etch resist
  providing a groove through the TCO layer down to the PV layer or down to the back electrode from the side of the TCO layer where the temporary substrate was present.

FIG. 2a shows a solar cell foil comprising a temporary substrate 1 with on top of it a TCO 2, a PV layer 3, a back electrode 4, and a permanent substrate 5. The interconnect 6 connects the TCO layer to the back electrode. An etch resist cap 7 is provided on the temporary substrate at the location of the interconnect. In FIG. 2*b* the same system is shown after removing the temporary substrate except where it is provided with the etch resist cap. Further, a groove fg has been established in the TCO layer so as to remove the short-circuit and complete the series connection.

In a preferred version of this embodiment, protective strips of an insulating material 8,9 are applied onto the PV layer before the back electrode is applied. The strips are applied at the location where in due course the grooves in the back electrode and in the TCO layer will be obtained. These strips are intended to protect the underlying material during the provision of the grooves, e.g., through laser scribing. This embodiment is illustrated in FIG. 2*c*.

A third embodiment of the process according the invention comprises the following steps:
  providing an etchable temporary substrate
  applying a front electrode of a transparent conductive oxide (TCO) onto the temporary substrate
  applying a photovoltaic layer (PV layer) onto the TCO layer and providing grooves through the PV layer down to the TCO layer or through the TCO layer down to the temporary substrate
  applying a back electrode layer onto the PV layer and in the grooves in such a way that inside the groove the back electrode is interconnected to the front electrode, but the back electrodes on both sides of the groove are electrically insulated from each other
  applying a permanent carrier
  in any one of the preceding steps providing an etch resist on the non-TCO side of the temporary substrate at the location of the interconnect
  selectively removing the temporary substrate where it is not covered with etch resist
  providing a groove through the TCO layer down to the PV layer or down to the back electrode from the side of the TCO layer where the temporary substrate was present.

Figure 3:
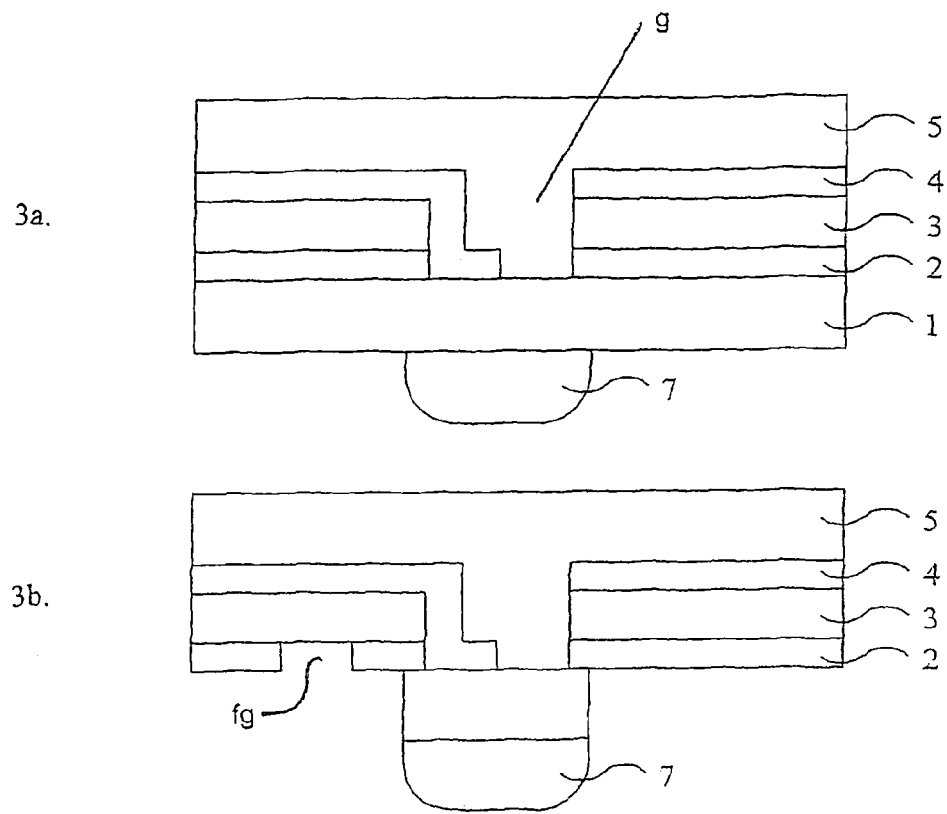
FIG. 3 shows process steps for making an embodiment of the solar module.

Some steps of one embodiment of this process are illustrated in FIG. 3. FIG. 3*a* shows a solar cell foil comprising a temporary substrate 1 with on top of it a TCO 2, a PV layer 3, a back electrode 4, and a permanent substrate 5. A groove g is present through the PV layer and through the TCO layer down to the temporary substrate. An etch resist cap 7 is provided on the temporary substrate at the location of the groove through the PV layer and the TCO layer. In FIG. 3*b* the same system is shown after removing the temporary substrate except where it is provided with the etch resist cap. The remaining part of the temporary substrate also functions to connect the back electrode from one side of the groove to the TCO layer at the other side of the cell. Further, a groove fg has been established in the TCO layer so as to remove the short-circuit and complete the series connection. One of the features of this process is that the protective cap also functions as part of the interconnect. Therefore, for this embodiment, the etchable temporary substrate should be conductive.

Figure 4:
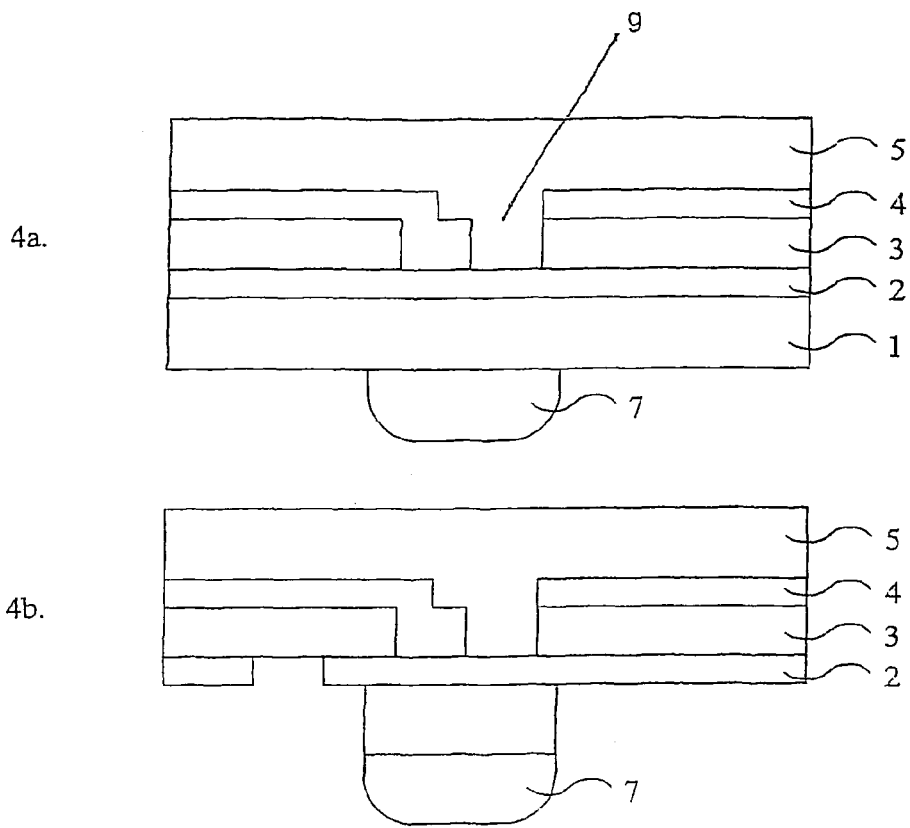
FIG. 4 shows process steps for making an embodiment having another interconnect in the solar module.

A second version of this embodiment is illustrated in FIG. 4. In this embodiment, the groove g in the PV layer does not extend through the TCO layer. In this embodiment the protective cap does not function as part of the interconnect, so it does not need to be conductive. Nevertheless the use of a conductive temporary substrate is preferred.

A fourth embodiment of the present invention comprises the following steps:
  providing an etchable temporary substrate
  applying a front electrode of a transparent conductive oxide (TCO) onto the temporary substrate
  applying a photovoltaic (PV) layer onto the TCO, and providing a groove through the PV layer and the TCO down to the temporary substrate, filling it with an insulating material, optionally while applying a cap, and, if so desired, applying an insulating strip, and establishing a (precursor of) a conductive connection through the PV layer down to the TCO
  applying a back electrode onto the PV layer
  providing a groove in the back electrode down to the PV layer or, if present, down to the insulating strip
  optionally applying a permanent carrier
  in any one of the preceding steps providing an etch resist on the non-TCO side of the temporary substrate at the location of the interconnect
  selectively removing the temporary substrate where it is not covered with etch resist.

Figure 5:
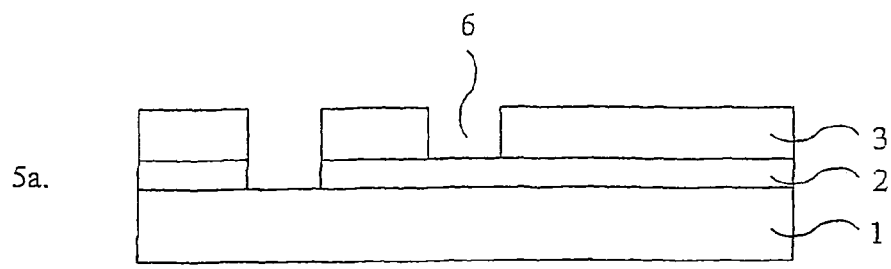
FIG. 5 shows an embodiment the solar module with insulating strips.
Figure 5:
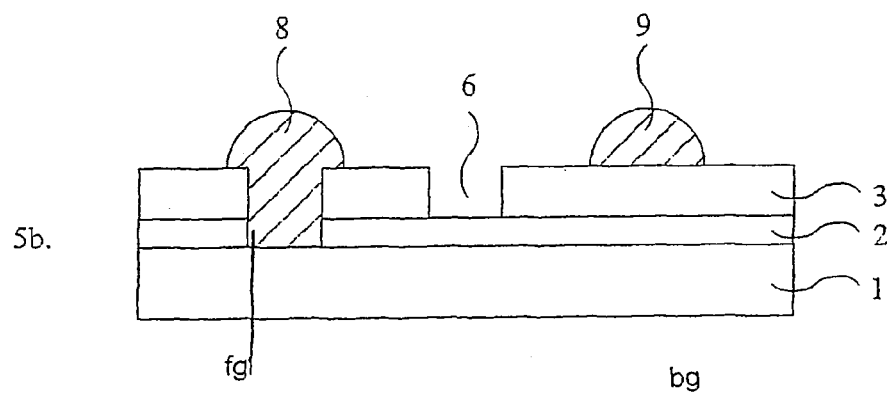
Figure 5:
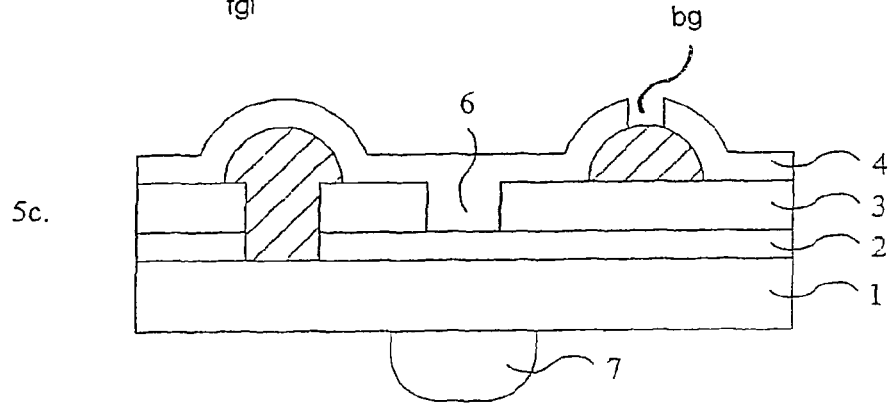
Figure 5:
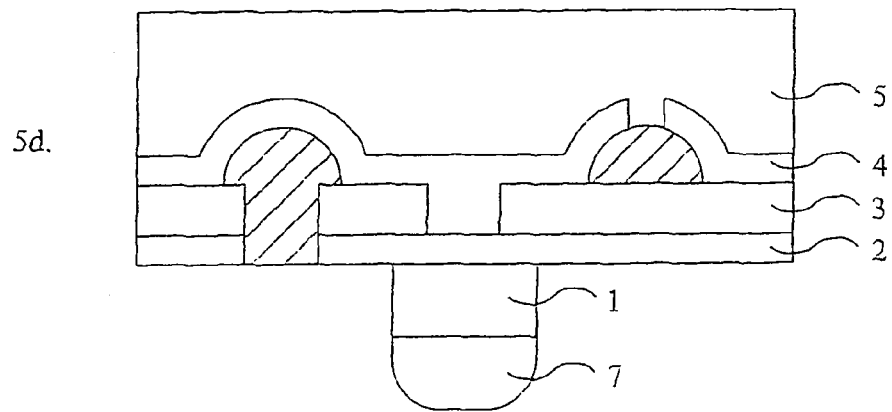

This process is illustrated in FIG. 5. FIG. 5*a* shows a solar cell foil comprising a temporary substrate 1 with on top of it a TCO 2 and PV layer 3. A groove fg is present through the PV layer and the TCO layer down to the temporary substrate. This groove fg will be filled with an insulating material 8. A further groove 6 has been provided through the PV layer down to the TCO. This groove 6 will form the basis for the interconnect, and may thus be seen as an interconnect precursor. In FIG. 5*b* strips of insulating material 8 and 9 have been provided, one in the groove through the PV layer and the TCO down to the temporary substrate, and one on the PV layer on the other side of the interconnect precursor 6. In FIG. 5*c* back electrode 4 has been added, with a groove bg on top of insulating strip 9. The interconnect is thus completed. Additionally, an etch resist cap 7 is provided on the temporary substrate at the location of the interconnect. In FIG. 5*d* the same system is shown after applying a permanent carrier 5 and removing the temporary substrate except where it is provided with the etch resist cap.

In this embodiment the (precursor of) the interconnect can be a groove which on application of the back electrode is filled with back electrode material. This is the embodiment illustrated in FIG. 5. Alternatively, although such a process is less favored at the moment, the groove can be filled with a conductive material in a separate step. Finally, if the PV layer is an amorphous Si layer, a conductive connection can also be established by recrystallising the amorphous Si to form a conductive material. This last option is the least favored one.

A fifth embodiment of the present invention comprises the following steps:
  a. providing a temporary substrate,
  b. applying a transparent conductive oxide (TCO)
  c. applying a photovoltaic (PV) layer on the TCO
  d. if so desired, applying one or two insulating strips onto the PV layer
  e. applying a back electrode onto the PV layer and, if they are present, onto the insulating strips
  f. if so desired, repairing shunts in the back electrode if no interconnect has been established as yet
  g. providing a groove in the back electrode down to the PV layer, or if it is present, down to an insulating strip
  h. if so desired, providing a permanent carrier
  i. in any one of the preceding steps providing an etch resist on the non-TCO side of the temporary substrate at the location of the interconnect
  j. selectively removing the temporary substrate where it is not covered with etch resist.
  k. providing a groove from the side of the TCO through the TCO and, optionally, through the PV layer down to the back electrode, or if it is present, down to an insulating strip
  l. if so desired, applying an encapsulant onto the TCO layer, in which process a conductive connection through the PV layer is established
   between steps f. and h, or
   between steps c. and e.

Figure 6:
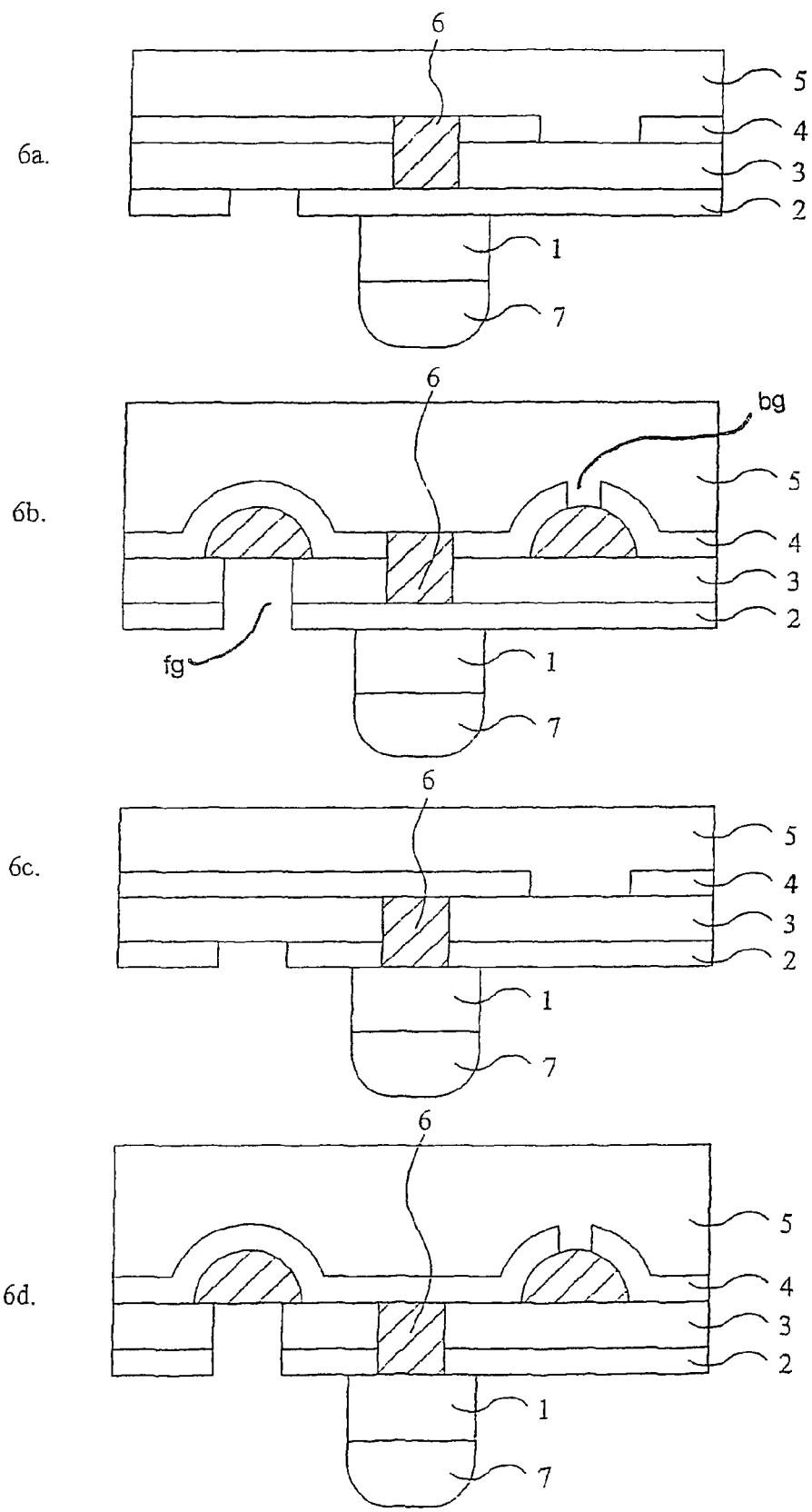
FIG. 6 shows another embodiment the solar module with insulating strips.

FIG. 6 illustrates various products resulting from different embodiments of this process. These figures all show a show a solar cell foil comprising a TCO 2, a PV layer 3, a back electrode 4, and a permanent substrate 5. The interconnect 6 connects the TCO layer to the back electrode. An etch resist cap 7 is present on the remainder of the temporary substrate 1 to protect the interconnect. The advantage of the embodiment wherein the conductive connection is established between steps f. and h. is that it is possible to effect shunt repair on the assemblage of TCO layer, PV layer, and back electrode before the conductive connection between the TCO layer and the back electrode is established.

The product of FIG. 6a is obtained by a process comprising the steps of:
a. providing a temporary substrate,
b. applying a transparent conductive oxide (TCO)
c. applying a photovoltaic (PV) layer onto the TCO
d. applying a back electrode onto the PV layer
e. if so desired, repairing shunts in the back electrode
f. providing a groove in the back electrode down to the PV layer, and providing an interconnect between the back electrode and the TCO layer
g. providing a permanent carrier
h. in any one of the preceding steps providing an etch resist on the non-TCO side of the temporary substrate at the location of the interconnect
i. selectively removing the temporary substrate where it is not covered with etch resist.
j. providing a groove from the side of the TCO through the TCO down to the PV layer.

The system of FIG. 6b differs from that of FIG. 6a in that two protective strips of an insulating material are applied onto the PV layer before application of the back electrode. The groove in the back electrode is made from the back electrode side down to the insulating strip. The groove fg from the TCO side is made through the TCO layer and the PV layer down to the other insulating strip.

In the embodiments of FIGS. 6a and 6b, the conductive connection between the TCO layer and the back electrode can be established in various ways. As the back electrode is already present at the time the interconnect 6 is established, the following options present themselves. If in this embodiment the PV layer is an amorphous Si layer, the conductive connection can be established by fusing the back electrode and the amorphous Si layer using a laser. Alternatively, it is possible in these embodiments to first scribe a groove from the back electrode side of the solar cell unit and establish or improve the interconnect by filling the groove with a conductive material. However, this option is less preferred.

The product of FIG. 6c differs from that of FIG. 6a in that the interconnect interrupts the TCO layer instead of the back electrode of the solar cell foil. It can be obtained through a process comprising the following steps:
a. providing a temporary substrate,
b. applying a transparent conductive oxide (TCO)
c. applying a photovoltaic (PV) layer on the TCO
d. providing an interconnect through the PV layer and optionally through the TCO layer
e. applying a back electrode onto the PV layer
f. providing a groove in the back electrode down to the PV layer
g. providing a permanent carrier
h. in any one of the preceding steps providing an etch resist on the non-TCO side of the temporary substrate at the location of the interconnect
i. selectively removing the temporary substrate where it is not covered with etch resist.
j. providing a groove from the side of the TCO through the TCO down to the PV layer.

The system of FIG. 6d differs from that of FIG. 6c in that two protective strips of an insulating material are applied onto the PV layer before application of the back electrode. The groove in the back electrode is made from the back electrode side down to the insulating strip. The groove from the TCO side is made through the TCO layer and the PV layer down to the other insulating strip. In this embodiment, the conductive connection between the TCO layer and the back electrode can be established in various ways. If in this embodiment the PV layer is an amorphous Si layer, the conductive connection can be established by recystallising the Si layer to form a conductive connection using a laser. Alternatively, and preferably, it is possible in this embodiment to first scribe a groove through the PV layer and the TCO layer and establish the interconnect by filling the groove with a conductive material.

The Temporary Substrate

The temporary substrate has to satisfy a number of conditions. It has to be etchable, as has been explained above. It has to be sufficiently heat-resistant to be able to endure the conditions prevailing during the manufacture of the solar cell foil, more particularly during the deposition of the TCO and the PV layer. It has to be strong enough to be able to carry the solar cell foil during its manufacture. It has to be easy to remove from the TCO layer without damaging the latter. If it is intended to play a role in the interconnect, it has to be sufficiently conductive. The person skilled in the art will be able to select a suitable temporary substrate within these guidelines.

The temporary substrate employed in the process according to the invention preferably is a foil of a metal or a metal alloy. The principal reasons for this are that such foils exhibit good conductivity, generally are able to withstand high processing temperatures, are slow to evaporate, and are comparatively easy to remove using known etching techniques. Another reason to choose a metal foil, more particularly aluminium or copper, is that in the end the solar cell foil has to be provided with edge electrodes which have to connect the solar cell foil to an apparatus or the electricity grid. Remaining pieces of temporary substrate may be used to this end, as a result of which there is no need for separate provision of the edge electrodes.

Suitable metals include steel, aluminium, copper, iron, nickel, silver, zinc, molybdenum, chromium, and alloys or multi-layers thereof. For economic reasons among others it is preferred to employ Fe, Al, Cu, or alloys thereof. Given their performance (and taking into account the matter of cost) aluminium, iron, and copper are preferred most.

Suitable etchants and techniques for removing metals are known, and while they differ per metal, the skilled person will be able to select the appropriate ones. Preferred etchants include acids (both Lewis and Brønstedt acids). Thus in the case of copper it is preferred to use $FeCl_3$, nitric acid or sulphuric acid. Suitable etchants for aluminium are, e.g., NaOH, KOH, and mixtures of phosphoric acid and nitric acid.

If copper, optionally prepared by way of electrodeposition, is used as temporary substrate, it is preferred to provide the copper, optionally via electrodeposition, with a non-reducing diffusion barrier layer, e.g., an anti-corrosion layer, more particularly zinc oxide. This is because copper may have the tendency to diffuse through the TCO layer in the PV layer. It is also possible to select a TCO capable of preventing such diffusion, e.g., $SnO_2$ or ZnO. The anti-diffusion layers can be applied by means of for instance electrodeposition, or via Physical Vapor Deposition (PVD) or via Chemical Vapor Deposition (CVD). The anti-diffusion layer generally is removed from the TCO together with the temporary substrate.

For ease of removal, the temporary substrate preferably is as thin as possible. Of course, its thickness has to be such that other layers can be provided on it and it has to be able to hold these together, but this generally does not require it to be more than 500 μm (0.5 mm) thick. The thickness preferably is in the range of 1 to 200 μm (0.2 mm). Depending on the modulus of elasticity, the minimum thickness for a large number of materials will be 5 μm. Accordingly, a thickness of 5-150 μm, more particularly 10-100 μm, is preferred.

The TCO Layer

Examples of suitable transparent conductive oxides (TCOs) are indium tin oxide, zinc oxide, zinc oxide doped with aluminium, fluorine, gallium or boron, cadmium sulphide, cadmium oxide, tin oxide, and, most preferably, F-doped $SnO_2$. Said last-mentioned transparent electrode material is preferred, because it can form a desired crystalline surface with a columnar light scattering texture when it is applied at a temperature above 400° C., preferably in the range of 500 to 600° C., or after-treated at said temperature. It is precisely in the case of this TCO material that the use of a temporary substrate capable of withstanding such a high temperature is extremely attractive. In addition, the material is resistant to most etchants and has a better resistance to chemicals than the much-used indium tin oxide. Also, it is far less costly.

The TCO can be applied by means of methods known in the field, e.g., by means of Metal Organic Chemical Vapor Deposition (MOCVD), sputtering, Atmospheric Pressure Chemical Vapor Deposition (APCVD), PECVD, spray pyrolysis, evaporation (physical vapor deposition), electrodeposition, electroless plating, screen printing, sol-gel processes, etc. or combinations of these processes. It is preferred to apply and after-treat the TCO layer at a temperature above 250° C., preferably above 400° C., more preferably between 450 and 600° C., so that a TCO layer of the desired composition, properties and/or texture can be obtained.

The Buffer Layer

If so desired, a buffer layer may be present between the TCO layer and the photovoltaic layer. The buffer layer is intended to protect the TCO layer from the conditions prevailing during the deposition of the PV layer. The nature of the buffer layer will depend on the nature of the PV layer. Suitable buffer layers for the various PV layers are known in the art. For cadmium telluride CdS, In(OH,S) and Zn(OH,S) may be mentioned. If in the present specification mention is made of depositing the PV layer on the TCO, a buffer layer may or may not be present on said TCO.

The Photovoltaic (PV) Layer

After application of the TCO layer the PV layer can be applied in an appropriate manner. It should be noted here that in the present description the term "PV layer" or "photovoltaic layer" comprises the entire system of layers needed to absorb the light and convert it into electricity. Suitable layer configurations are known, as are the methods for applying them. For the common general knowledge in this field reference may be had to Yukinoro Kuwano, "Photovoltaic Cells," Ullmann's *Encyclopedia*, Vol. A20 (1992), 161 and "Solar Technology," Ullmann's *Encyclopedia*, Vol. A24 (1993), 369.

Various thin film semiconductor materials can be used in manufacturing the PV layers. Examples are amorphous silicon (a-Si:H), microcrystalline silicon, polycrystalline amorphous silicon carbide (a-SiC) and a-SiC:H, amorphous silicon-germanium (a-SiGe), and a-SiGe:H. In addition, the PV layer in the solar cell foil according to the invention may comprise CIS (copper indium diselenide, $CuInSe_2$), cadmium telluride (CdTe), CIGSS (Cu(In,Ga)(Se,S)), $Cu(In,Ga)Se_2$, ZnSe/CIS, ZnO/CIS, and/or Mo/CIS/CdS/ZnO, and dye sensitised solar cells.

The PV layer preferably is an amorphous silicon layer when the TCO comprises a fluorine-doped tin oxide. In that case the PV layer will generally comprise a set, or a plurality of sets, of p-doped, intrinsic, and n-doped amorphous silicon layers, with the p-doped layers being situated on the side receiving the incident light.

In the a-Si—H embodiment the PV layer will at least comprise a p-doped amorphous silicon layer (Si-p), an intrinsic amorphous silicon layer (Si-i), and an n-doped amorphous silicon layer (Si-n). It may be that onto the first set of p-i-n layers a second and further p-i-n layers are applied. Also, a plurality of repetitive p-i-n ("pinpinpin" or "pinpinpinpin") layers can be applied consecutively. By stacking a plurality of p-i-n layers, the voltage per cell is raised and the stability of the system is enhanced. Light-induced degradation, the so-called Staebler-Wronski effect, is diminished. Furthermore, the spectral response can be optimized by choosing different band-gap materials in the various layers, mainly the i-layers, and particularly within the i-layers. The overall thickness of the PV layer, more particularly of all the a-Si layers together, will generally be of the order of 100 to 2,000 nm, more typically about 200 to 600 nm, and preferably about 300 to 500 nm.

The Back Electrode

The back electrode in the thin film solar cell sheet according to the invention preferably serves both as reflector and as electrode. Generally, the back electrode will have a thickness of about 50 to 500 nm, and it may comprise any suitable material having light reflecting properties, preferably aluminium, silver, or a combination of layers of both, and making good ohmic contact with the subjacent semiconductor layer. Preferably, it is possible to apply the metal layers at a comparatively low temperature, say less than 250° C., by means of, e.g., electrodeposition, (in vacuo) physical vapor deposition or sputtering. In the case of silver, it is preferred to first apply an adhesion promoter layer. $TiO_2$, TiN, ZnO, and chromium oxide are examples of suitable materials for an adhesion promoter layer and have the advantage of also possessing reflecting properties when applied in a suitable thickness, e.g., of 50-100 nm. The required back electrode may be either transparent or opaque.

The Permanent Carrier

The solar cell foil is provided with a permanent carrier. For, otherwise the foil will be so thin that its fragility makes for difficult handling. The permanent carrier is applied on the back electrode. Suitable carrier layer materials include films of commercially available polymers, such as polyethylene terephthalate, poly(ethylene 2,6-naphthalene dicarboxylate), polycarbonate, polyvinyl chloride, PVDF, PVDC, PPS, PES, PEEK, PEI or films of polymer having very good properties such as aramid or polyimide films, but also, for example, metal foils onto which an insulating (dielectric) surface layer may have been applied, or compositions of plastics and reinforcing fibres and fillers. Polymeric "co-extruded" films provided with a thermoplastic adhesive layer having a softening point below that of the substrate itself are preferred. If so desired, the co-extruded film may be provided with an anti-diffusion layer of, e.g., polyester (PET), copolyester or aluminium. Preferably, the carrier is a film or foil with a thickness of preferably 50 μm to 10 mm. Preferred ranges are 75 μm to 3 mm and 100 μm to 300 μm. The bending stiffness of the carrier, defined within the context of this description as the product of the modulus of elasticity E in $N/mm^2$ and the thickness t to the power of three in mm ($E \times t^3$), preferably is higher than $16 \times 10^{-2}$ Nmm and will generally be lower than $15 \times 10^6$ Nmm. The carrier is preferably suitable for use in a roll-to-roll process.

The carrier may comprise a structure as required for its final use. Thus the substrate may comprise tiles, roofing sheets and elements, facade elements, car and caravan roofs, etc. In general, however, preference is given to the carrier being flexible. In that case a roll of solar cell foil is obtained which is ready for use and where sheets of the desired power and voltage can be cut off the roll. These can then be incorporated into (hybrid) roof elements or be applied onto tiles, roofing sheets, car and caravan roofs, etc., as desired.

If so desired, a top coat or surface layer may be provided on the TCO side of the solar cell to protect the TCO from outside influences. Generally, the surface layer will be a polymer sheet (with cavities if so desired) or a polymer film. The surface layer is required to have a high transmission and for instance comprises the following materials: (per)fluorinated polymers, polycarbonate, poly(methylmethacrylate), PET, PEN or any clear coating available, such as the ones used in the car industry. If so desired, an additional anti-reflection or anti-fouling layer may be provided. Alternatively, if so desired, the entire solar cell may be incorporated into such an encapsulant.

The Etch Resist

The etch resist can be any material which can be applied to the temporary substrate at the location of the interconnect which will protect the temporary substrate from the action of the etchant. The skilled person can select suitable material by routine testing. Suitable etch resists include thermoplastic and thermoset polyurethanes and polyimides, thermoset polymers such as EP, UP, VE, SI, (epoxy)resins, and acrylates, and thermoplastic polymers such as PVC, PI, fluorpolymers, etc. The etch resist generally includes additives such as photoinitiators or other hardeners, fillers, plastifiers, etc. The etch resist may be temporary, that is, it may be removed at some further stage of the process. Alternatively, and preferably, the etch resist may be permanent.

The etch resist is suitably applied by vaporising or printing/writing. Preferably, the etch resist is applied by means of a printing process known as such. Suitable printing processes include silk screening, roto screen printing, ink-jet processes, flexgravure, etc. The color of the etch resist can be regulated by the incorporation of suitable pigments or dyes known to the skilled person. Especially for permanent etch resists, the presence of pigments and UV stabilisers may be preferred.

The invention claimed is:

1. A process for manufacturing a solar cell foil comprising:
   providing an etchable temporary substrate;
   applying a front electrode of a transparent conductive oxide (TCO) onto a first side of the temporary substrate;
   applying a photovoltaic layer onto the TCO;
   applying a back electrode;
   applying a permanent carrier ensuring that the front electrode and the back electrode are electrically connected in an interconnect to establish a series connection, the front and the back electrode each being interrupted by a front groove and a back groove, respectively, at different sides of the interconnect,
   wherein in any one of the preceding steps after application of the TCO:
      the thickness of the temporary substrate is reduced by etching part of the temporary substrate;
      subsequently an etch resist is applied on a second side of the temporary substrate opposite to the first side of the temporary substrate covering the interconnect, and at least not at the entire width of the front groove;
      followed by selectively removing portions of the temporary substrate where it is not covered with the etch resist, to obtain the solar cell foil provided with a protective cap on the TCO.

2. The process of claim 1, wherein applying of the etch resist on the second side of the temporary substrate is performed directly before the selectively removing portions of the temporary substrate.

3. The process of claim 1, wherein the etch resist is a permanent etch resist.

4. The process of claim 3, wherein a color of the etch resist is selected such that the color of the etch resist matches or contrasts with a color of an energy-generating part of the solar cell unit.

5. The process of claim 1, wherein the etch resist is a temporary etch resist.

6. The process of claim 1, which is carried out in a roll-to-roll process.

7. The process of claim 2, wherein the etch resist is a permanent etch resist.

8. The process of claim 2, wherein the etch resist is a temporary etch resist.

9. The process of claim 2, which is carried out in a roll-to-roll process.

10. The process of claim 3, which is carried out in a roll-to-roll process.

11. The process of claim 4, which is carried out in a roll-to-roll process.

12. The process of claim 5, which is carried out in a roll-to-roll process.

13. A process for manufacturing a solar cell foil comprising:
   providing an etchable temporary substrate;
   applying a front electrode of a transparent conductive oxide (TCO) onto a first side of the temporary substrate;
   applying a photovoltaic layer onto the TCO;
   applying a back electrode;
   applying a permanent carrier ensuring that the front electrode and the back electrode are electrically connected in an interconnect to establish a series connection, the front and the back electrode each being interrupted by a front groove and a back groove, respectively, at different sides of the interconnect,
   wherein in any one of the preceding steps after application of the TCO:
      the thickness of the temporary substrate is reduced by etching part of the temporary substrate;
      subsequently an etch resist is applied on a second side of the temporary substrate opposite to the first side of the temporary substrate covering the interconnect, and at least not at the entire width of the front groove;
      followed by selectively removing portions of the temporary substrate where it is not covered with the etch resist, to obtain the solar cell foil provided with a protective cap on the TCO, and the protective cap extends beyond the interconnect at both sides.

* * * * *